(12) United States Patent
Ben Khalifa et al.

(10) Patent No.: US 8,294,359 B2
(45) Date of Patent: Oct. 23, 2012

(54) ELECTRONIC COMPONENT WITH P-DOPED ORGANIC SEMICONDUCTOR

(75) Inventors: Mohamed Ben Khalifa, Amesano (IT); David Vaufrey, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 141 days.

(21) Appl. No.: 12/223,600

(22) PCT Filed: Feb. 28, 2007

(86) PCT No.: PCT/FR2007/000363
§ 371 (c)(1),
(2), (4) Date: Aug. 28, 2008

(87) PCT Pub. No.: WO2007/099229
PCT Pub. Date: Sep. 7, 2007

(65) Prior Publication Data
US 2009/0015154 A1    Jan. 15, 2009

(30) Foreign Application Priority Data
Feb. 28, 2006  (FR) ....................... 06 50683

(51) Int. Cl.
*H01L 51/54*  (2006.01)
(52) U.S. Cl. ......................... 313/504; 428/690
(58) Field of Classification Search .................. 313/504; 428/690
See application file for complete search history.

(56) References Cited

U.S. PATENT DOCUMENTS

| | | | |
|---|---|---|---|
| 4,481,132 A | 11/1984 | Dubois et al. | |
| 5,093,698 A | 3/1992 | Egusa | |
| 5,674,597 A * | 10/1997 | Fujii et al. | 428/212 |
| 5,942,374 A | 8/1999 | Smayling | |
| 6,013,384 A | 1/2000 | Kido et al. | |
| 6,433,355 B1 | 8/2002 | Riess et al. | |
| 6,525,465 B1 | 2/2003 | Fujita | |
| 6,566,807 B1 | 5/2003 | Fujita et al. | |
| 6,639,357 B1 | 10/2003 | Parthasarathy et al. | |
| 2001/0046611 A1* | 11/2001 | Kido et al. | 428/690 |
| 2003/0038287 A1* | 2/2003 | Suzuki et al. | 257/40 |
| 2004/0062949 A1 | 4/2004 | Pfeiffer et al. | |
| 2005/0110009 A1 | 5/2005 | Blochwitz-Nimoth et al. | |
| 2005/0170211 A1 | 8/2005 | Fujioka | |

FOREIGN PATENT DOCUMENTS

| | | |
|---|---|---|
| EP | 498979 A1 * | 8/1992 |
| EP | 0 948 063 A2 | 10/1999 |
| WO | WO 03/083958 A2 | 10/2003 |
| WO | WO 2006/056586 A1 | 6/2006 |

* cited by examiner

*Primary Examiner* — Nimeshkumar Patel
*Assistant Examiner* — Mary Ellen Bowman
(74) *Attorney, Agent, or Firm* — Oliff & Berridge, PLC

(57) ABSTRACT

An electronic component comprising a layer of organic semiconducting material in which a dopant is dispersed having an energy difference between the work function of the dopant and of the HOMO level of said organic semiconducting material that is less than 0.5 eV. The dopant is an atomic element having an evaporation temperature lower than 1300° C. for a pressure of $10^{-8}$ Torr. The invention enables the toxicity problems connected with usual organic acceptor dopants to be avoided. It applies in particular to organic light-emitting diodes.

6 Claims, 1 Drawing Sheet

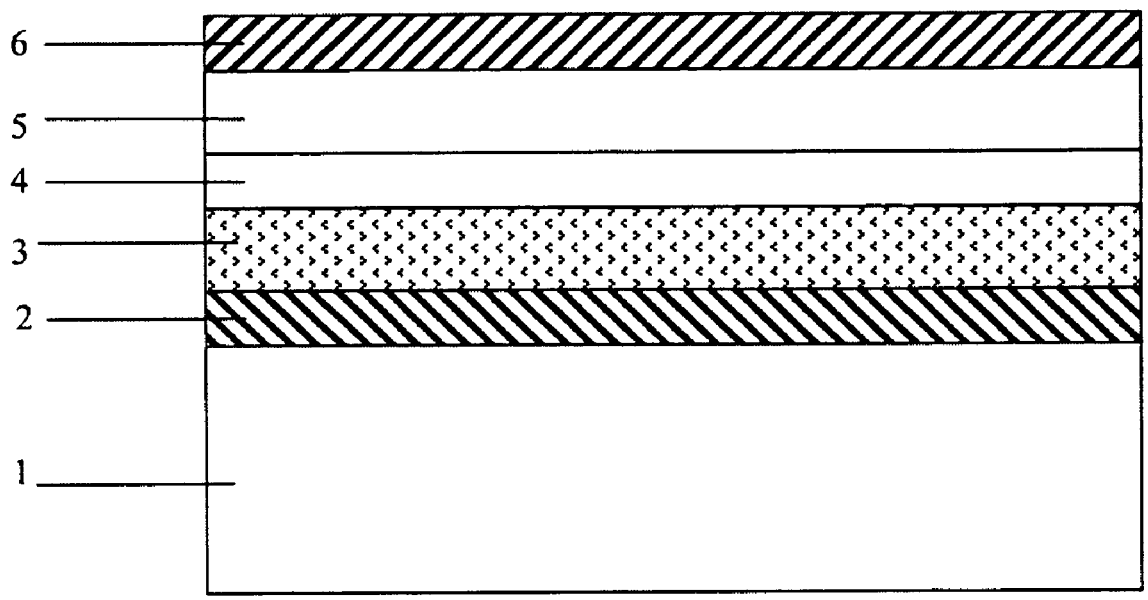

ELECTRONIC COMPONENT WITH P-DOPED ORGANIC SEMICONDUCTOR

BACKGROUND OF THE INVENTION

The invention relates to p-doping of organic semiconducting materials having a base in particular formed by small molecules (as opposed to polymers), and to the use of these doped semiconductors in particular for light-emitting diodes, organic transistors, or for any other electronic component. The p-dopants are electron acceptor dopants; they are therefore generally oxidative with regard to the material they dope.

STATE OF THE ART

Fabrication of transistors or diodes with an organic semiconductor having a base formed by small molecules generally requires a vacuum deposition step on a substrate generally previously provided with one or more electrodes called bottom electrodes; in this step, the semiconductor molecule is evaporated in a vacuum chamber so that it recondenses on this substrate to form a deposition layer; one or more electrodes called top electrodes are then generally deposited on the organic layer.

The document U.S. Pat. No. 6,525,465 refers to organic light-emitting diodes in which a thin insulating film is arranged between the cathode and the organic layer for ease of injection of electrons from the cathode.

The organic semiconducting materials of the organic layers deposited in this way are sometimes n-doped or p-doped so as to increase the density of charges, electrons or holes which participate in the electric conduction of these layers. In the case of transistors, doping is also the means for achieving organic semiconducting-drain (or source) contacts having very weak energy barriers. In the case of diodes, this n- or p-doping in particular increases the charge density for transporting electrons or holes, thereby reducing ohmic losses. To obtain doped layers, deposition is then generally performed by co-evaporation of the organic semiconducting material and of the dopant in a vacuum.

Organic light-emitting diodes generally comprise an organic light-emitting layer inserted between an anode and a cathode. To facilitate injection of holes via the anode and transporting of these holes to the organic light-emitting layer, it is known to insert, between this layer and the anode, a layer of p-doped organic semiconducting material called hole transporting layer; symmetrically, to facilitate injection of electrons via the cathode and transporting of these electrons to the organic light-emitting layer, it is known to insert, between this layer and the cathode, a layer of n-doped organic semiconducting material called electron transporting layer. The documents U.S. Pat. Nos. 5,093,698, 6,566,807, WO2003/083958 and US2004/062949 describe diodes of this kind. These doped layers can themselves act as electrodes as described in the document U.S. Pat. No. 6,433,355; the document U.S. Pat. No. 663957 describes the case of a cathode made of organic semiconducting material that is n-doped, in particular by lithium or strontium.

Since n- or p-doping of the transporting layers enables high-conductivity transporting layers to be obtained, the ohmic losses are limited and thicker transporting layers can be used that are better suited to a high light extraction ratio by resonant optic cavity effect between the electrodes.

The material of these transporting layers also has to be suited to the material of the electrode, anode or cathode, with which they are in contact so as to limit the possible potential barrier at the interface.

The material generally used for the cathodes is chosen from materials that present a weak ionization potential, generally lower than or equal to 3 eV; the semiconductor material generally used for the electron transporting layer is chosen from materials whose energy at LUMO (Lowest Unoccupied Molecular Orbital) level is close to, and preferably higher (absolute value) than the ionization potential of the cathode material; n-doping of this semi-conductor, by creating a Schottky junction at the interface with the cathode, enables semiconducting materials having a lower LUMO level energy (absolute value) than the ionization potential of the cathode material to be used; the n-doping level is then adjusted in a manner known as such to the height of the potential barrier which the electrons have to be able to pass at the interface with the cathode; to obtain efficient n-doping, the n-dopant, which is an electron donor, has to present a higher work function (or a HOMO level energy in the case of an organic dopant) than the LUMO level energy of the semi-conducting material of the electron transporting layer, and which is preferably lower than the work function of the cathode material. The document U.S. Pat. No. 6,013,384 thus fixes the upper limit of the work function at 4.2 eV for the n-dopants of the electron transporting layer. This document U.S. Pat. No. 6,013,384 describes an organic light-emitting diode comprising an anode, a cathode, an organic light-emitting layer which is inserted between this anode and this cathode, a layer of organic semiconducting material n-doped by means of a donor dopant, which is inserted between this organic light-emitting layer and the cathode, where the donor dopant is chosen from the group formed by alkaline elements, alkaline earth elements, transition metals and rare earths which present a work function which is lower than or equal to 4.2 eV in absolute value.

The material generally used for the anodes is chosen from materials which present a high ionization potential, generally higher than or equal to 4 eV; the semiconducting material generally used for the hole transporting layer is chosen from materials whose HOMO (Highest Occupied Molecular Orbital) level energy is close to and preferably lower than (absolute value) the ionization potential of the cathode material; p-doping of this semiconductor, by creating a Schottky junction at the interface with the anode, enables semiconducting materials having a higher HOMO level energy (absolute value) than the ionization potential of the anode material to be used; the p-doping level is then adjusted in a manner known as such to the height of the potential barrier which the holes have to be able to pass at the interface with the anode; to obtain efficient p-doping, the p-dopant, which is an electron acceptor, has to present a work function, or a LUMO level energy in the case of an organic dopant, which is lower than the HOMO level energy of the semi-conducting material of the hole transporting layer, and which is preferably higher than the work function of the anode material. The p-dopants that are usually suitable are generally organic dopants, such as F4-TCNQ; these organic p-dopants are generally toxic.

OBJECT OF THE INVENTION

One object of the invention is to provide an alternative to p-type organic dopants, in particular to limit toxicity problems.

The electronic component according to the invention comprises a layer of organic semiconducting material in which a dopant is dispersed having an energy difference between the work function of the dopant and of the HOMO level of said organic semi-conducting material that is less than 0.5 eV, characterized in that said dopant is an atomic element having an evaporation temperature of less than 1300° C. at a pressure of $10^{-8}$ Torr.

In the case where the electronic component is a TFT transistor, the drain and source are generally in a same plane, and the same layer of organic semiconducting material can be in contact with the drain (or source); according to the invention, it is the portion of this layer in contact with one of the drain or source electrodes that is p-doped with a dopant formed by an atomic element.

In the case of a light-emitting diode, the layer of p-doped organic semiconducting material serves the purpose of injecting and transporting holes from the anode to an organic light-emitting layer of this diode.

In the case in particular where the anode material is ITO (Indium Tin Oxide) with a work function of about 4.7 eV, the acceptor dopant presents a work function higher than or equal to 4.7 eV.

The concentration of said acceptor dopant in said organic semiconducting material is preferably adjusted so that the conductivity of said material is higher than $10^{-7}$ S/cm. This concentration generally corresponds to a sufficiently significant and not fortuitous p-type doping.

Obtaining a conductivity of more than $10^{-7}$ S/cm requires a molar ratio interval between the dopant and organic semiconductor of between 1/1000 and 10/1, depending on the required conductivity and the nature of the dopant—organic semiconductor couple.

Said dopant is preferably chosen from the group formed by boron, carbon, silicon, cobalt, nickel, copper, germanium, rhodium, palladium, and antimony. These elements advantageously present both a toxicity and an evaporation temperature in a vacuum that are not practically prohibitive.

The electronic component according to the invention is preferably an organic light-emitting diode comprising an anode, a cathode, and an organic light-emitting layer that is inserted between this anode and this cathode. The additional layer of p-doped organic semiconducting material is advantageously inserted between this organic light-emitting layer and the anode. The p-doped layer therefore serves the purpose here of injecting and transporting holes from the anode into the organic light-emitting layer.

The thickness of said p-doped organic semiconducting material layer is preferably higher than or equal to 30 nm. If the hole transporting layer comprises a p-doped part and a non p-doped part, only the thickness of the doped part is taken into account here. The thickness of this layer is preferably less than or equal to 100 nm, in particular to limit ohmic losses in the diode.

DETAILED DESCRIPTION OF THE INVENTION

The invention will be better understood on reading the following description, given for non-restrictive example purposes only with reference to appended FIG. 1, which represents an organic light-emitting diode structure according to an embodiment of the invention. The invention is applicable to any other electronic component.

With reference to FIG. 1, an anode 2 is deposited on an insulating substrate 1. The anode is for example made from ITO, whose work function is equal to 4.7 eV; Deposition is performed in conventional manner, for example by cathode sputtering in vacuum.

A layer 3 of p-doped organic semiconducting material designed to serve the purpose of transporting holes is then deposited. Deposition is performed by co-evaporation in vacuum of this organic semiconducting material and of the p-dopant which is here an inorganic chemical element having an ionization potential higher than or equal to 4.7 eV; cobalt or nickel are for example used; unlike the p-doping described in the documents EP0948063 and U.S. Pat. No. 4,481,132, the product that is co-deposited with the semiconductor is therefore not an inorganic chemical salt element, or a Lewis acid; the degree of oxidation of the co-deposited element is therefore here equal to zero, whereas it is generally higher than zero when a salt or a Lewis acid is used.

An organic light-emitting layer 4, an electron transporting layer 5, and a cathode 6 are then deposited in a manner known as such. A thin electron blocking layer can be optionally added between hole transporting layer 3 and organic light-emitting layer 4, and/or a thin hole blocking layer can be added between organic light-emitting layer 4 and electron transporting layer 5. The material forming the electron blocking layer can be the same semiconductor, but not doped, as that of p-doped organic semiconducting material layer 3. The materials and the thickness of layers 4, 5 and 6 are known as such and will not be described in detail here.

An organic light-emitting diode according to the invention is then obtained that presents a good light efficacy due to the presence of the low-resistivity p-doped organic semiconducting material layer. As the p-dopant is an atomic element preferably chosen from the group formed by boron, carbon, silicon, cobalt, nickel, copper, germanium, rhodium, palladium, and antimony, the p-doping is efficient as these elements present an ionization potential higher than or equal to 4.7 eV. The p-doping is not dangerous to implement, as none of these elements is very toxic, and deposition by co-evaporation is possible as the evaporation temperature in vacuum of these elements is sufficiently low.

The dopant is advantageously an atomic element having an evaporation temperature lower than 1300° C. for a pressure of $10^{-8}$ Torr.

Platinum and gold are not suitable to constitute the dopant, given that gold is known for diffusing between the layer and platinum for having a high evaporation temperature.

As a specific embodiment example of this diode according to the invention, the following stacking can be cited: layer 2: ITO—layer 3: Co-doped NPB—layer 4: Alq3—layer 5: Cs-doped BPhen—layer 6: aluminium; as an alternative, an electron blocking layer is added between layers 3 and 4: non-doped NPB—and a hole blocking layer between layers 4 and 5: BCP.

P-doped organic semiconducting material layer 3 preferably presents a thickness higher than or equal to 30 nm so as to be able to optimize the cavity effects in the diode without important consequences on the voltage, given the high conductivity of this layer with respect to the non-doped layers.

It is sometimes advantageous to dope the organic layer on one edge only so as to limit diffusion of the dopant into an adjacent active layer.

Another solution to provide for diffusion of the dopants into this active layer would consist in introducing a non-doped second layer of different nature. This second layer is adjacent to the doped organic layer, but would have a smaller thickness to limit ohmic losses.

The present invention has been described with reference to an organic light-emitting diode where the anode is a bottom electrode and the cathode a top electrode; the invention also applies to diodes whose cathode is a bottom electrode and whose anode is a top electrode.

The present invention also applies to any electronic component, in particular an organic transistor, comprising at least one electrode and an organic material layer that is in contact with this electrode.

The invention claimed is:

1. An organic light-emitting diode comprising:
    a p-type layer for injecting and transporting holes, the layer comprising an organic semiconducting material formed from small molecules, and
    the layer is doped with an inorganic chemical atomic element selected from the group consisting of boron, carbon, silicon, cobalt, nickel, copper, germanium, rhodium, palladium, and antimony.

2. The organic light-emitting diode according to claim 1, wherein a molar ratio between the dopant and the organic semiconducting material is from 1/1000 to 10/1, and the molar ratio is chosen to obtain a conductivity of the organic semiconducting material greater than $10^{-7}$ S/cm.

3. The organic light-emitting diode according to claim 1, wherein a thickness of the doped organic semiconducting material layer is greater than or equal to 30 nm.

4. The organic light-emitting diode according to claim 1, wherein the organic semiconducting material layer has a non-doped edge.

5. The organic light-emitting diode according to claim 1, wherein the doped organic semiconducting material layer is adjacent to a non-doped layer of smaller thickness.

6. An organic light-emitting diode comprising:
    an anode,
    a cathode,
    an organic light-emitting layer between the anode and cathode, and
    a p-type organic layer between the organic light-emitting layer and the anode;
    the p-type layer comprising an organic semiconducting material formed from small molecules, and
    the p type layer is doped with an inorganic chemical atomic element selected from the group consisting of boron, carbon, silicon, cobalt nickel, copper, germanium, rhodium, palladium, and antimony.

* * * * *